United States Patent [19]

Ueda

[11] Patent Number: 4,932,073
[45] Date of Patent: Jun. 5, 1990

[54] TRANSMITTER HAVING PLL CIRCUIT

[75] Inventor: Hideki Ueda, Tokyo, Japan

[73] Assignee: NEC Corporation, Tokyo, Japan

[21] Appl. No.: 298,728

[22] Filed: Jan. 19, 1989

[30] Foreign Application Priority Data

Jan. 19, 1988 [JP] Japan .................... 63-7452

[51] Int. Cl.$^5$ .................. H04B 1/04; H01Q 11/12
[52] U.S. Cl. ................. 455/113; 455/117;
455/119; 455/115; 331/10; 331/16; 331/175;
332/127; 332/128
[58] Field of Search ............... 455/115, 113, 119, 117;
331/16, 10, 25, 74, 175; 332/127, 128; 375/62,
72, 73

[56] References Cited

U.S. PATENT DOCUMENTS

| 4,379,270 | 4/1983 | Carter | 331/16 |
| 4,564,821 | 1/1986 | Reichart | 331/74 |
| 4,573,026 | 2/1986 | Curtis | 455/113 |
| 4,731,870 | 3/1988 | Black | 455/113 |

Primary Examiner—Joseph A. Orsino
Assistant Examiner—Kinfe-Michael Negash
Attorney, Agent, or Firm—Sughrue, Mion, Zinn, Macpeak & Seas

[57] ABSTRACT

A transmitter includes a phase-locked loop (PLL) circuit whose output is frequency modulated with a modulation signal. The modulated signal is amplified by an amplifier which is turned on only during a signal transmission of the transmitter. At a time when the amplifier is turned, the output frequency of PLL circuit fluctuates. To depress this frequency fluctuation, the transmitter includes a frequency fluctuation depressing (FFD) circuit. Upon the turning-on of the amplifier, FFD circuit applies a voltage change to the modulation signal so that the frequency fluctuation is depressed.

13 Claims, 2 Drawing Sheets

TRANSMITTER HAVING PLL CIRCUIT

BACKGROUND OF THE INVENTION

The present invention relates to a transmitter having a phase-locked loop (PLL) circuit which receives a modulation signal and supplies a modulated signal, and an amplifier connected to the output of the PLL circuit.

If a transmitter has a PLL circuit, a transmission frequency can be changed and set to a desired frequency. The output of the PLL circuit is usually amplified by an amplifier connected thereto. To save power, power is supplied to the amplifier only during signal transmission. However, the input impedance of the amplifier fluctuates when the amplifier is turned on. This causes the output frequency of the PLL circuit to also fluctuate, resulting in improper transmission.

SUMMARY OF THE INVENTION

An object of the present invention is therefore to provide a transmitter comprising an improved phase-locked loop (PLL) circuit which does not suffer the aforementioned disadvantage of conventional transmitter with a PLL circuit.

Another object of the present invention is to provide a transmitter which comprises a PLL circuit and a circuit for depressing frequency fluctuations in the output of the PLL circuit.

Yet another object to the invention is to provide a transmitter which comprises a frequency fluctuation depressing circuit to depress frequency fluctuations in the output of a PLL circuit, which fluctuation is caused by the turning on of an amplifier connected to the PLL circuit.

According to the present invention, there is provided a transmitter comprising a PLL circuit to produce an oscillation signal, the frequency of the oscillation signal varying with a modulation signal. An amplifier is connected to the PLL circuit to amplify the output thereof. A switch circuit turns on and off the amplifier. A frequency fluctuation depressing FFD circuit is connected to the PLL circuit and the switch circuit to depress frequency fluctuations in the output of the PLL circuit by changing the voltage of the modulation signal at a time when the amplifier is turned on.

BRIEF DESCRIPTION OF THE DRAWINGS

The above and other objects, features and advantages of the present invention will become more apparent from the following description referring to the accompanying drawings, in which.

DETAILED DESCRIPTION OF THE PREFERRED EMBODIMENT

Figure 1:
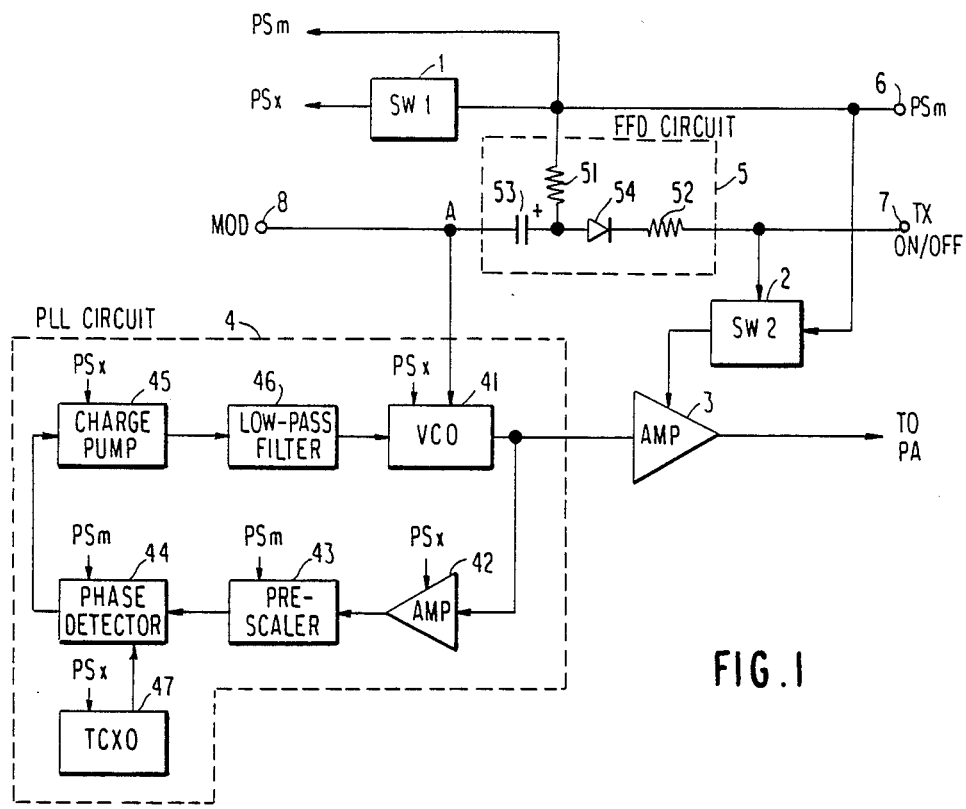
FIG. 1 is a block diagram showing a preferred embodiment of the present invention.

In FIG. 1, a transmitter includes a phase-locked loop (PLL) circuit 4 to change the transmission frequency. The output of PLL circuit 4 is amplified by an amplifier 3 and provided to a power amplifier (not shown) and then to an antenna (also not shown) for radiation to a receiver. Power to the amplifier 3 is provided from a power supply terminal 6 through a switch circuit 2. Power to the components of PLL circuit 4 is provided from the terminal 6 directly and through a switch circuit 1 as shown in FIG. 1.

The PLL circuit 4 comprises a voltage-controlled oscillator (VCC) 41 which generates a desired frequency. The output of VCO 41 is amplified by an amplifier 42 and then applied to a pre-scaler 43. The pre-scaler 43 frequency divides the output of amplifier 42 and provides a frequency divided signal to a phase detector 44. The phase detector 44 is also provided with a reference signal from a crystal oscillator 47 and compares the phases of two inputs to produce a phase error signal. The phase error signal is applied to VCO 41 through a charge pump circuit 45 and a low-pass filter 46 to control the output frequency of VCO 41.

Figure 2:
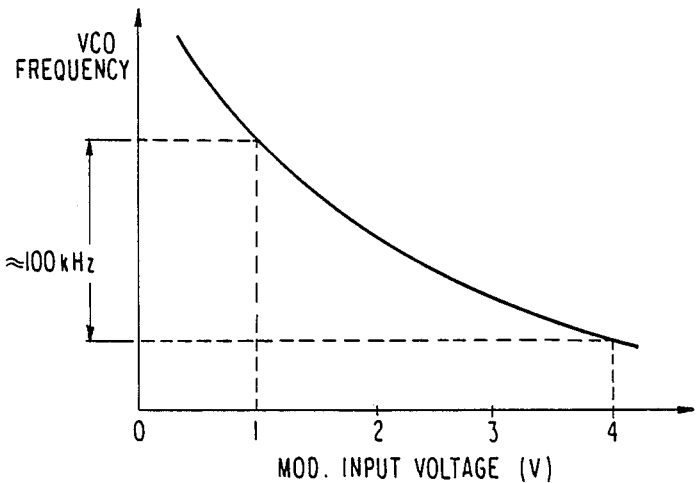
FIG. 2 shows a modulation input voltage vs. output frequency characteristic of a voltage-controlled oscillator (VCO) in the circuit of FIG. 1.

A modulation signal is applied to VCO 41 through a terminal 8. VCO 41 has a frequency characteristic with respect to the input voltage of the modulation signal, as shown in FIG. 2. Thus, VCO 41 produces a signal frequency modulated with the modulation signal. The modulated signal is fed to the amplifier 3.

When the transmitter transmits the modulated signal, the amplifier 3 is turned on by being provided with power through the switch circuit 2. The switch circuit 2 is controlled with a transmitter on/off signal which has high and low levels when the transmitter is turned off and on, respectively (see FIG. 3A). When the transmitter on/off signal has a high level, the switch circuit 2 is open to provide no power to the amplifier 3. When the transmitter on/off signal has a low level, the switch circuit 2 is closed to provide power to the amplifier 3.

As mentioned earlier, the input impedance of the amplifier 3 fluctuates at a time when the amplifier 3 is turned on. This input impedance fluctuation causes the output frequency of VCO 41 to also fluctuate, as shown in FIG. 3B. More particularly, when the amplifier 3 is turned on at a time t1 in FIG. 3A, the output frequency of VCO 41 fluctuates from a desired frequency $f_2$ to a frequency of $f_2-f_1$, as shown in FIG. 3B. This frequency fluctuation may be about 5 kHz.

A frequency fluctuation depressing FFD circuit 5 is added to depress the above-mentioned frequency fluctuation. FFD circuit 5 includes resistors 51 and 52, a capacitor 53 and a diode 54. The resistor 51 has one terminal connected to the power supply terminal 6 and the other terminal connected to an anode of diode 54. A cathode of diode 54 is connected to one terminal of resistor 52, the other terminal thereof being connected to the transmitter on/off signal supply terminal 7. Also, one terminal of capacitor 53 is connected to the anode of diode 54. The other terminal of capacitor 53 is connected to the modulation signal supply terminal 8.

Figure 3A:
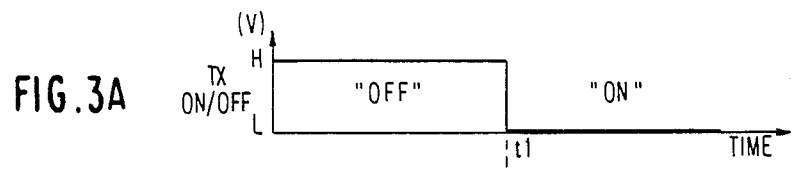
FIGS. 3A to 3E show timing diagrams for explaining the operation of the circuit shown in FIG. 1.
Figure 3B:
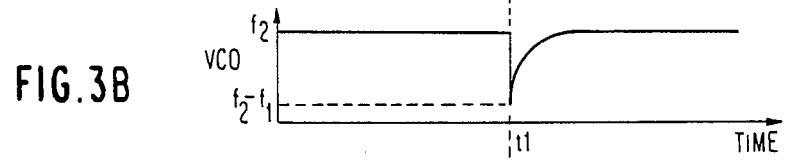
Figure 3C:
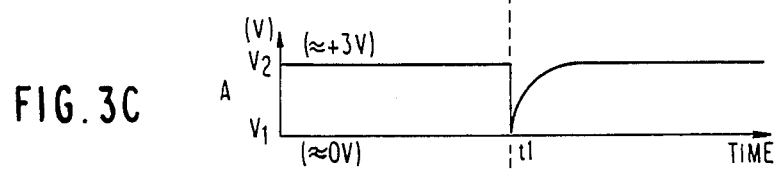

In operation, when the transmitter is turned on, i.e., the transmitter on/off signal changes from a high level to a low level at a time t1, as shown in FIG. 3A, the diode 54 is turned on. At this time, a negative-going pulses passes through the resistor 52, the diode 54 and the capacitor 53. Then, the capacitor 53 is charged through the resistor 51. As a result, a voltage at a connection point A changes as shown in FIG. 3C. Since VCO 41 has a frequency characteristic of FIG. 2, the voltage change at node A (FIG. 3C) causes the output frequency of VCO 41 to fluctuate from the desired frequency $f_2$ to a frequency of $f_2+f_1$, as shown in FIG, 3D.

Figure 3D:
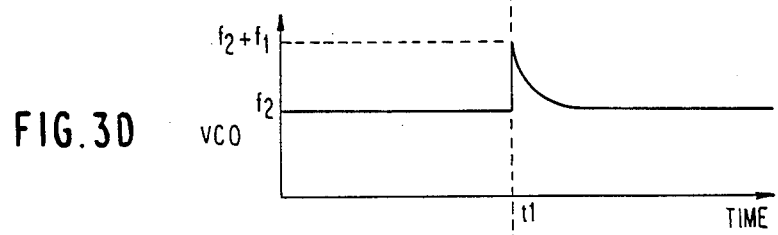
Figure 3E:
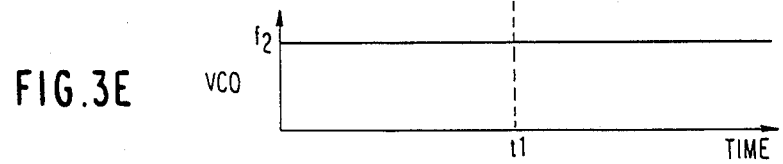

The frequency fluctuation of FIG. 3D is the reverse direction of the frequency fluctuation (FIG. 3B) due to the turning-on of the amplifier 3. Thus, if the resistances of resistors 51 and 52 and the capacitance of capacitor 53 are properly selected, the frequency fluctuation due to the turning-on of the amplifier 3 can be cancelled, as shown in FIG. 3E. The resistors of 10 kΩ and 18 kΩ have been employed as the resistors 51 and 52, respectively, and the capacitor of 1 microfarad (μF) as the capacitor 53, so that the frequency fluctuation of 5 kHz has sufficiently been depressed.

What is claimed is:

1. A transmitter comprising:
   phase-locked loop (PLL) circuit means for producing an oscillation signal, the frequency of said oscillation signal varying with a control signal;
   amplifier means connected to the output of said PLL circuit means for amplifying said output;
   switch means for turning on and off said amplifier means; and
   frequency fluctuation depressing means connected to said PLL circuit means and said switch means for depressing frequency fluctuation in the output of said PLL circuit means by changing the voltage of said control signal at a time when said amplifier means is turned on.

2. A transmitter as claimed in claim 1 further comprising power supply means, and wherein said frequency fluctuation depressing means comprises capacitor means, one terminal of said capacitor means being connected to said PLL circuit means; diode means, an anode of said diode means being connected to the other terminal of said capacitor; first resistor means connected between said power supply means and the connection of said anode and the other terminal of said capacitor; and second resistor means connected between a cathode of said diode and said switch means.

3. A transmitter as claimed in claim 1, wherein said PLL circuit means comprises voltage-controlled oscillator (VCO) means for producing said oscillation signal, said VCO means changing the frequency of said oscillation signal in response to said control signal and to a phase error signal; phase detector means responsive to the output of said VCO means and to a reference oscillation signal for comparing their phases to produce said phase error signal; and means for supplying said phase error signal from said phase detector means to said VCO means.

4. A transmitter comprising:
   oscillator means for providing an oscillation signal, the frequency of said oscillation signal being changed in response to a voltage change in a modulation signal;
   amplifier means connected to the output of said oscillator means for amplifying said oscillation signal;
   power supply means for supplying power to said oscillator means and said amplifier means, the beginning of power supply to said amplifier means causing fluctuation in the frequency of said oscillation signal; and
   frequency fluctuation depressing means responsive to the beginning of power supply to said amplifier means for changing the voltage of said modulation signal so that said fluctuation in the frequency of said oscillation signal can be depressed.

5. A transmitter as claimed in claim 4, wherein said oscillator means comprises phase-locked loop circuit means including: reference oscillator means for producing a reference signal; phase detector means for comparing the phases of said reference and oscillation signals to provide an error signal; and voltage-controlled oscillator means for producing said oscillation signal in response to said modulation and error signals.

6. A transmitter as claimed in claim 4 further comprising switch means responsive to a control signal for switching on and off power supply to said amplifier means.

7. A transmitter as claimed in claim 6, wherein said frequency fluctuation depressing means comprises first resistor means receiving said control signal; diode means connected in series with said first resistor means; capacitor means connected in series with said diode means and receiving said modulation signal; and second resistor means connected between said power supply means and the junction of said diode means and said capacitor means.

8. A transmitter comprising:
   a phase-locked loop circuit for supplying a modulated output signal;
   an amplifier for amplifying the output of said phase-locked loop circuit to a predetermined level, the impedance of said amplifier changing with the application of power thereto causing the frequency of said modulated output signal to change in a first direction; and
   a frequency fluctuation depressing circuit responsive to the start of power supply to said amplifier for causing said phase-locked loop circuit to change its output frequency in a reverse direction of frequency change from that which is due to the onset of power to said amplifier.

9. A method of depressing frequency fluctuation in the output of a phase-locked loop (PLL) circuit, said fluctuation being caused by the turning-on of an amplifier connected to the output of said PLL circuit, said method comprising the following steps of:
   providing an output from said PLL circuit which has been modulated with a modulating signal; and
   responsive to the turning-on of said amplifier, changing the voltage of said modulation signal so that said fluctuation can be depressed.

10. A method of depressing frequency fluctuation in the output of an oscillator circuit, comprising the following steps of:
    generating an oscillation signal with said oscillator circuit, the frequency of said oscillation signal being changed in response to a voltage change in a modulation signal;
    amplifying said oscillation signal with an amplifier;
    supplying power to said amplifier, the start of power supply to said amplifier causing said frequency fluctuation; and
    responsive to the start of said power supply to said amplifier, changing the voltage of said modulation signal so that said frequency fluctuation is depressed.

11. A method as claimed in claim 10, wherein said step of generating an oscillation signal comprises the steps of: producing a reference signal; comparing the phases of said reference and oscillation signals to produce a phase error signal; and responsive to said modulation and phase error signals, producing said oscillation signal.

12. A method as claimed in claim 10 further comprising the step of, responsive to a control signal, switching on and off power supply to said amplifier.

13. A method as claimed in claim 12, wherein said step of changing the voltage of said modulation signal comprises the step of, responsive to a voltage change of said control signal, producing a voltage change in said modulation signal so that said frequency fluctuation can be depressed.

* * * * *